United States Patent
Perner

(10) Patent No.: US 9,064,568 B2
(45) Date of Patent: Jun. 23, 2015

(54) CIRCUIT AND METHOD FOR READING A RESISTIVE SWITCHING DEVICE IN AN ARRAY

(75) Inventor: Frederick Perner, Santa Barbara, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 14/239,053

(22) PCT Filed: Aug. 26, 2011

(86) PCT No.: PCT/US2011/049337
§ 371 (c)(1),
(2), (4) Date: Feb. 14, 2014

(87) PCT Pub. No.: WO2013/032424
PCT Pub. Date: Mar. 7, 2013

(65) Prior Publication Data
US 2014/0198559 A1 Jul. 17, 2014

(51) Int. Cl.
*G11C 11/00* (2006.01)
*G11C 11/34* (2006.01)
(Continued)

(52) U.S. Cl.
CPC .......... *G11C 13/004* (2013.01); *G11C 13/0007* (2013.01); *G11C 2013/0054* (2013.01); *G11C 11/15* (2013.01); *G11C 11/16* (2013.01)

(58) Field of Classification Search
CPC ...... G11C 11/16; G11C 13/004; G11C 7/062; G11C 2013/0045; G11C 13/0064; G11C 2029/5006; G11C 11/5628; G11C 11/5642; G11C 16/10; G11C 16/24; G11C 7/12
USPC .......... 365/148, 158, 96, 171, 173, 174, 175, 365/205, 207, 210.1, 210.14, 210.15, 185.2, 365/185.07, 185.12, 185.18, 185.21, 185.23
See application file for complete search history.

(56) References Cited

U.S. PATENT DOCUMENTS

| 6,259,644 B1 | 7/2001 | Tran et al. |
| 6,574,129 B1 | 6/2003 | Tran |

(Continued)

FOREIGN PATENT DOCUMENTS

| GB | 2452567 A | 3/2009 |
| JP | 2001-184856 | 7/2001 |

OTHER PUBLICATIONS

International Search Report and Written Opinion, Korean IPO, Apr. 10, 2012. Hewlett-Packard Development Company, L.P., PCT Application No. PCT/US11/49337.
(Continued)

*Primary Examiner* — Hien Nguyen
(74) *Attorney, Agent, or Firm* — Hewlett-Packard Patent Department

(57) ABSTRACT

A read circuit for sensing a resistance state of a resistive switching device in a crosspoint array utilizes a transimpedance equipotential preamplifier connected to a selected column line of the resistive switching device in the array. The equipotential preamplifier delivers a sense current while maintaining the selected column line at a reference voltage near a biasing voltage applied to unselected row lines of the array. A reference resistor is selectively connected to the equipotential preamplifier for setting a reference current, wherein the equipotential preamplifier is set to produce a preamplifier output voltage having a magnitude depending on whether the sense current is smaller or greater than the reference current. A voltage comparator is connected to the equipotential preamplifier to compare the preamplifier output voltage with a setup reference voltage and generate a comparator output voltage indicative of the resistance state of the resistive switching device.

15 Claims, 6 Drawing Sheets

(51) Int. Cl.
    *G11C 13/00*     (2006.01)
    *G11C 11/15*     (2006.01)
    *G11C 11/16*     (2006.01)

(56) References Cited

U.S. PATENT DOCUMENTS

| | | | |
|---|---|---|---|
| 7,006,025 | B2 | 2/2006 | Schippers et al. |
| 7,495,984 | B2 | 2/2009 | Kim et al. |
| 7,518,934 | B2 | 4/2009 | Bedeschi et al. |
| 7,813,166 | B2 | 10/2010 | Jung et al. |
| 8,942,026 | B2 * | 1/2015 | Perner .......................... 365/148 |
| 2001/0012228 | A1 * | 8/2001 | Perner .......................... 365/210 |
| 2004/0240276 | A1 | 12/2004 | Perner et al. |
| 2005/0169034 | A1 | 8/2005 | Perner |
| 2005/0195647 | A1 | 9/2005 | Perner |
| 2010/0118588 | A1 | 5/2010 | Chen et al. |
| 2011/0157958 | A1 | 6/2011 | Sasaki |

OTHER PUBLICATIONS

Supplementary European Search Report, Nov. 21, 2014, European Patent Application No. 11871717.2, 3 pages.

* cited by examiner

CIRCUIT AND METHOD FOR READING A RESISTIVE SWITCHING DEVICE IN AN ARRAY

BACKGROUND

Memristive devices, or memristors, are a new type of switching devices with an electrically switchable device resistance. Memristive devices are both scientifically and technically interesting, and hold promise for non-volatile memory (NVM) and other fields. With today's flash memory technology reaching its scaling limit, there is an urgent need for new memory technologies that can meet the storage capacity and speed demanded by future applications. Memories using resistive switching devices, such as memristors, are a promising candidate for meeting that need. For NVM applications, many nanoscale resistive switching devices can be formed in a two-dimensional array, such as a crossbar structure, to provide a very high storage capacity. Nevertheless, it has been a major challenge to reliably read the resistance state of a selected resistive switching device in an array, due that existence of other switching devices in the array that may form paths for leakage current, which can significantly reduce the signal/noise ratio of the read operation.

DETAILED DESCRIPTION

The following description provides a circuit having a transimpedance pre-amplifier for reading the resistance state of a resistive switching device in an array of switching devices, and a corresponding method for performing the read operation. In some embodiments, the reading circuit may provide a digital output to represent the resistance state of switching device. For instance, a digital "0" may indicate that the device is in a high resistance state, or an "OFF" state, while a digital "1" may indicate that the device is in a low resistance state, or an "ON" state.

Figure 1:
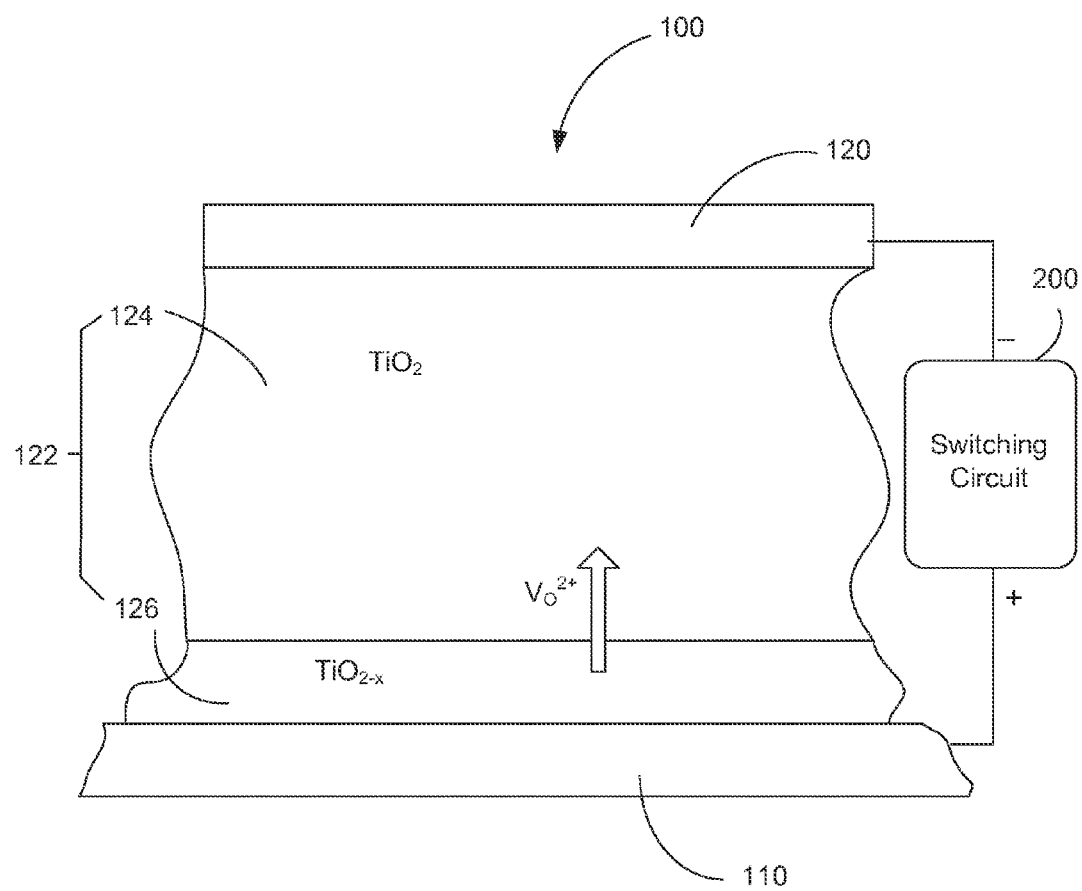
FIG. 1 is a schematic cross-sectional view of an example of a memristive device as one type of resistive switching device.
Figure 2:
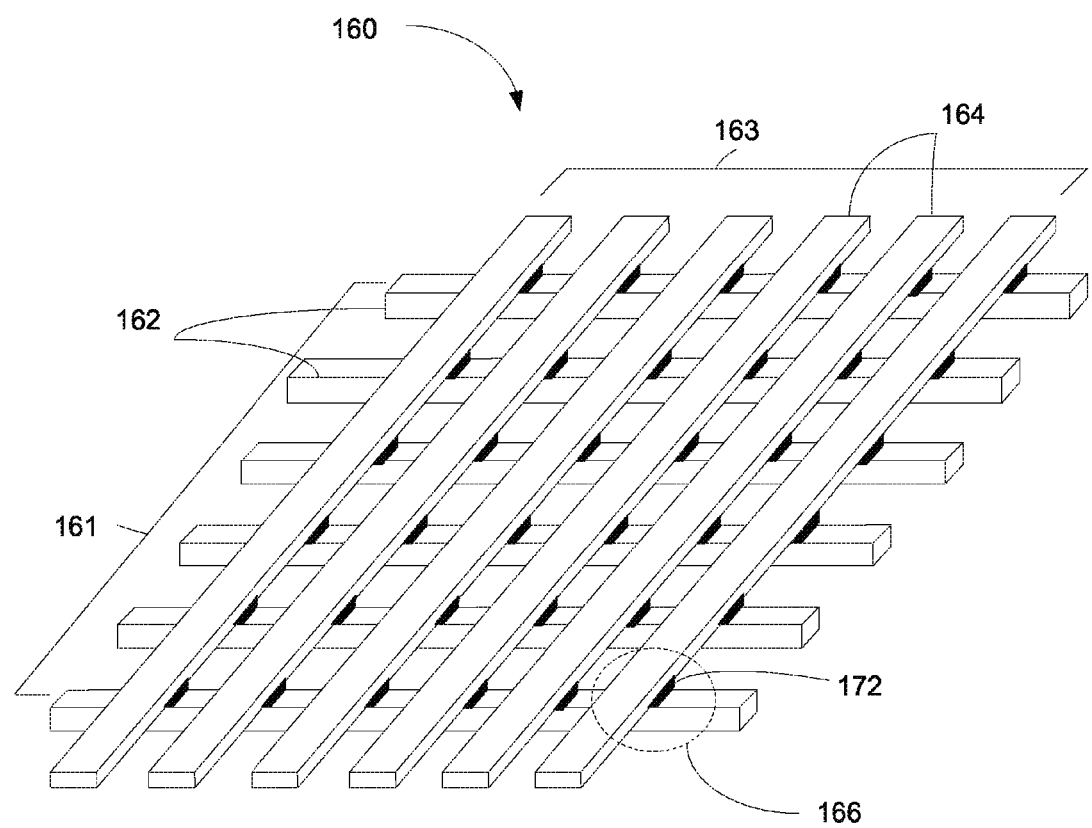
FIG. 2 is a schematic view of a crossbar structure containing multiple resistive switching devices.

In some embodiments, the resistive switching device may be a bipolar memristive device (or memristor). As used herein, a memristive device is a switching device with its resistance representing its switching state, and the resistance depends on the history of the voltage and current applied to the device. The term "bipolar" means that the device can be switched from a low-resistance state ("LRS") to a high-resistance state ("HRS") by applying a switching voltage of one polarity, and from a high-resistance state to a low-resistance state by applying a switching voltage of the opposite polarity. FIG. 1 shows, in a schematic form, an example of a bipolar memristive device 100. In the embodiment shown in FIG. 1, the memristive device is a two-terminal device, with a top electrode 120 and a bottom electrode 110. An active region 122, where the switching behavior takes place, is disposed between the two electrodes. The active region 122 of the switching device 100 includes a switching material that may be electronically semiconducting or nominally insulating, as well as a weak ionic conductor. The switching material contains dopants that may be driven under a sufficiently strong electric field to drift through the switching material, resulting in changes in the resistance of the memristive device. The memristive device 100 can be used, for example, as a non-volatile memory cell, for storing digital information. Such a memory cell may be incorporated into a crossbar structure to provide a high storage capacity, as illustrated in FIG. 2.

Many different materials with their respective suitable dopants can be used as the switching material. Materials that exhibit suitable properties for switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The listing of possible switching materials is not exhaustive and do not restrict the scope of the present invention. The dopant species used to alter the electrical properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies. For GaN, the dopant species may be nitride vacancies or sulfide ions. For compound semiconductors, the dopants may be n-type or p-type impurities.

The nanoscale switching device 100 can be switched between ON and OFF states by controlling the concentration and distribution of the oxygen vacancies in the switching material in the active region 122. When a DC switching voltage is applied across the top and bottom electrodes 120 and 110, an electric field is created across the active region 122. The switching voltage and current may be supplied by a switching circuit 200. The electric field across the active region 122, if of a sufficient strength and proper polarity, may drive the oxygen vacancies to drift through the switching material towards the top electrode 120, thereby turning the device into an ON state.

By way of example, as shown in FIG. 1, in one embodiment the switching material may be $TiO_2$. In this case, the dopants that may be carried by and transported through the switching material are oxygen vacancies ($Vo^{2+}$). The active region 122 of the switching device has two sub-regions or layers: a primary region 124 and a secondary region 126. The primary region 124 is the main place where the switching behavior occurs. In the originally formed state of the device, the primary region 124 has a relatively low dopant concentration, while the secondary region 126 has a relatively high dopant level. The secondary region 126 functions as a dopant source/drain. During a switching operation, dopants may be driven from the secondary region 126 into the primary region 124, or from the primary region to the secondary region, to change the distribution of dopants in the primary region, thereby changing the conductivity across the primary region.

If the polarity of the electric field is reversed, the dopants may drift in an opposite direction across the switching material and away from the top electrode 120, thereby turning the device into an OFF state. In this way, the switching is reversible and may be repeated. Due to the relatively large electric field needed to cause dopant drifting, after the switching voltage is removed, the locations of the dopants remain stable in the switching material. The switching is bipolar in that voltages of opposite polarities are used to switch the device on and off. The state of the switching device 100 may be read by applying a read voltage to the bottom and top electrodes 110 and 120 to sense the resistance across these two electrodes. The read voltage is typically much lower than the threshold voltage required to induce drifting of the ionic dopants between the top and bottom electrodes, so that the read operation does not alter the resistance state of the switching device.

Memristive switching devices may be formed into an array for various applications that benefit from having a high density of switching devices. FIG. 2 shows an example of a two-dimensional array 160 of memristive switching devices. The array 160 has a first group 161 of generally parallel nanowires 162 running in a first direction, and a second group 163 of generally parallel nanowires 164 running in a second direction at an angle, such as 90 degrees, from the first direction. One group of the nanowires may be labeled as the row lines, and the other group may be labeled as the column lines. The two layers of nanowires 162 and 164 form a two-dimensional lattice which is commonly referred to as a crossbar structure, with each nanowire 162 in the first layer intersecting a plurality of the nanowires 164 of the second layer, and vice versa. A memristive switching device 166 may be formed at each intersection of the nanowires 162 and 164. The switching device 166 has a nanowire of the second group 163 as its top electrode and a nanowire of the first group 161 as the bottom electrode, and an active region 172 containing a switching material between the two nanowires. Each memristive device 166 in the two-dimensional array can be uniquely addressed by selecting the row line and column line that form the electrodes of the memristive device.

As mentioned above, one challenge that results from the use of a crossbar memory structure is that it can be difficult to reliably read the resistance state of a selected device in the array. To sense the resistance state of the selected device, a sensing voltage may be applied to the device via the row line and column line of the device, and the current flowing through the selected device may be monitored to determine the resistance of the device. There are, however, other switching devices connected to the selected row line or the selected column line. Those devices, referred to as "half-selected" devices, can form paths for leakage current, and it can be difficult to isolate the current flowing through the selected device from the leakage current, which can be rather large if there are many devices on each row line or column line.

Figure 3:
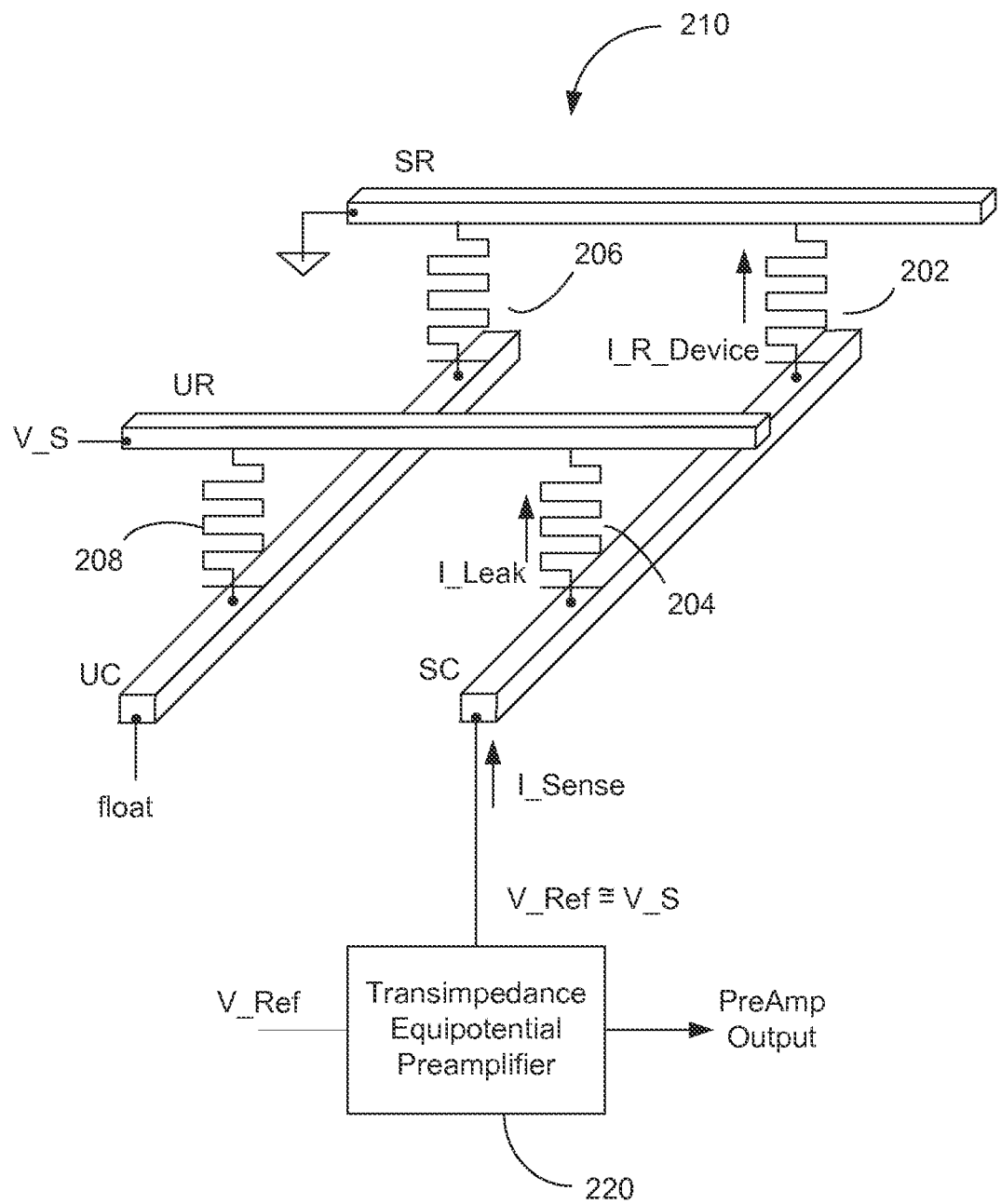
FIG. 3 is a schematic diagram representing an abstraction of a crossbar of resistive switching devices.

To facilitate a better understanding of the issue of leakage current in a crossbar and how it can complicate the operation of reading a selected resistive switching device (or the "target device"), FIG. 3 shows an abstraction of a crossbar 210 in a simplified form. The target device 202 (shown in electronic circuit symbol of a memristor) to be read is at the intersection of a selected row line SR and a selected column line SC. The unselected row UR in FIG. 3 represents all rows in the crossbar 210 other than the selected row SR, and the unselected column line UC represents all columns of the crossbar 210 other than the selected column line. The device 204 represents all other resistive switching devices connected in parallel to the selected column line SC, and the device 206 represents all other resistive switching devices connected in parallel to the selected row line SR. The device 208 represents all resistive switching devices in the crossbar 210 that are not connected to either the selected column or the selected row. When a read voltage is applied across the selected column SC and the selected row SR, the devices 204 and 206 become half-selected. If there is a voltage difference between the selected row or column line and the unselected lines, the half-selected devices will pass leakage currents due to their finite resistance values. Such leakage currents are a form of noise for the read operation. If there are many switching devices connected to each row or column line in the crossbar, the magnitude of the leakage current can become rather large, and can swamp the real signal of the read operation, which is the current passing through the target device under the read voltage.

An effective solution to the leakage current problem is to bias all the unselected row lines in the crossbar to substantially the same voltage that is applied to the selected column line during the read operation. As illustrated in FIG. 3, when the unselected row line UR is biased to substantially the same voltage as the selected column line, the leakage current passing through the half-selected device 204 will be zero or very small. Thus, the sensing current I_Sense flowing through the selected column SC can have a very small noise component and be mostly the read current I_R_Device flowing through the target device 202. This approach, termed "equipotential sensing," provides an effective way to achieve a reasonably high signal/noise ratio for the read operation. To maintain the selected column line SC at substantially the same voltage of the unselected row lines, an equipotential preamplifier 220 may be used. The equipotential preamplifier 220 is connected to the selected column SC, and has a reference voltage input. For the read operation, the reference voltage V_Ref is set to be substantially the same as sense voltage V_S to which the unselected row lines are biased. The equipotential preamplifier holds the selected column line SC to the reference voltage V_Ref while allowing the sensing current I_Sense to flow to the crossbar 210 through the selected column line SC. The effectiveness of the equipotential sensing technique depends on the proper setting of the reference voltage for the equipotential preamplifier. The reference voltage V_Ref is set not only to be close to the biasing voltage V_S on the unselected row lines so as to reduce the leakage current, but also to enable the equipotential preamplifier to operate in a linear range. Moreover, it is desirable to have a convenient and effective way to determine the resistance state of the target device and to indicate the state in an easy-to-read format.

Figure 4:
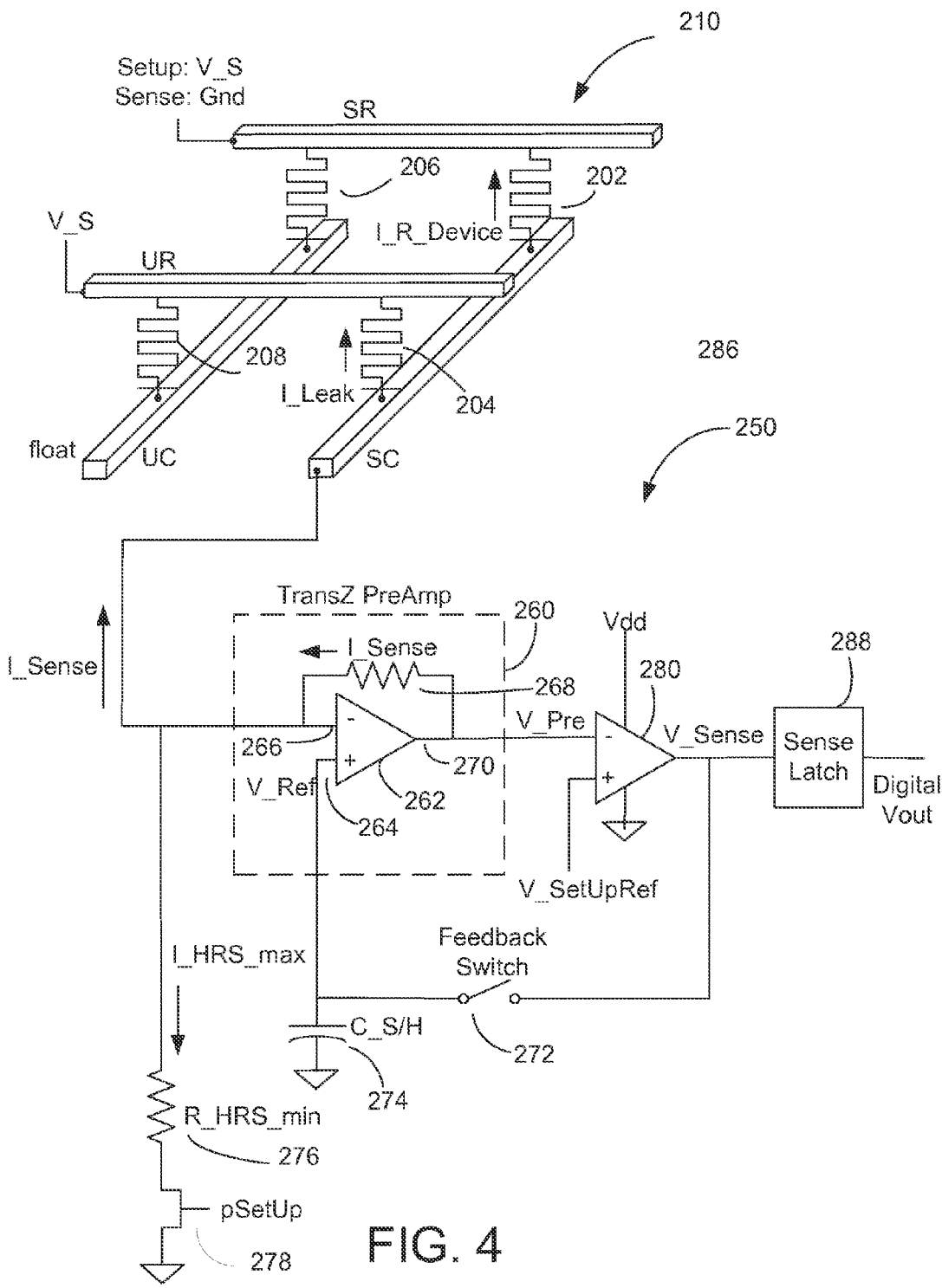
FIG. 4 is a schematic diagram of an electronic circuit with a transimpedance equipotential preamplifier for reading a selected resistive switching device in a crossbar.

FIG. 4 shows an embodiment of an "equipotential sensing" circuit 250 which includes an equipotential preamplifier 260. The equipotential preamplifier 260 is a transimpedance amplifier, and is represented in FIG. 4 as an operational amplifier 262 with a feedback resistor 268 connecting the negative input 266 and output 270 of the operational amplifier. Thus, the equipotential preamplifier 260 converts a current output into a voltage output. The reference voltage V_Ref goes to the positive input 264 of the operational amplifier 262. The output of the operational amplifier 262 is connected to the negative input of a voltage comparator 280. The voltage comparator 280 has a voltage V_SetUpRef connected to its positive input. The output of the voltage comparator 280 is connected to the input of a sense latch 288, which provides a digital output indicative of the resistance of the target device 202 being read by the circuit 250.

For setting up the reference voltage V_Ref, the circuit 250 has reference voltage setting components which include a feedback switch 272 and a sample-and-hold capacitor 274. The circuit utilizes feedback to set the reference voltage V_Ref. The reference setting components further includes a reference resistor 276 and a transistor 278. The transistor 278 functions as a switch for connecting the reference resistor 276 to the ground or breaking that electrical connection under the control of a control pulse pSetUp. The resistance of the reference resistor 276, designated R_HRS_min, is selected to be of a value smaller than the range of resistance for a resistive switching device in a high-resistance state (or OFF state), but distinguishably larger than the low-resistance state (or ON state) value of the device. As explained in greater detail below, the use of the reference resistor 276 in a set-up stage allows the equipotential preamplifier 260 to be set up such that the ON or OFF state of the target device can be determined in the sensing stage in a very simple and convenient way.

Figure 5:
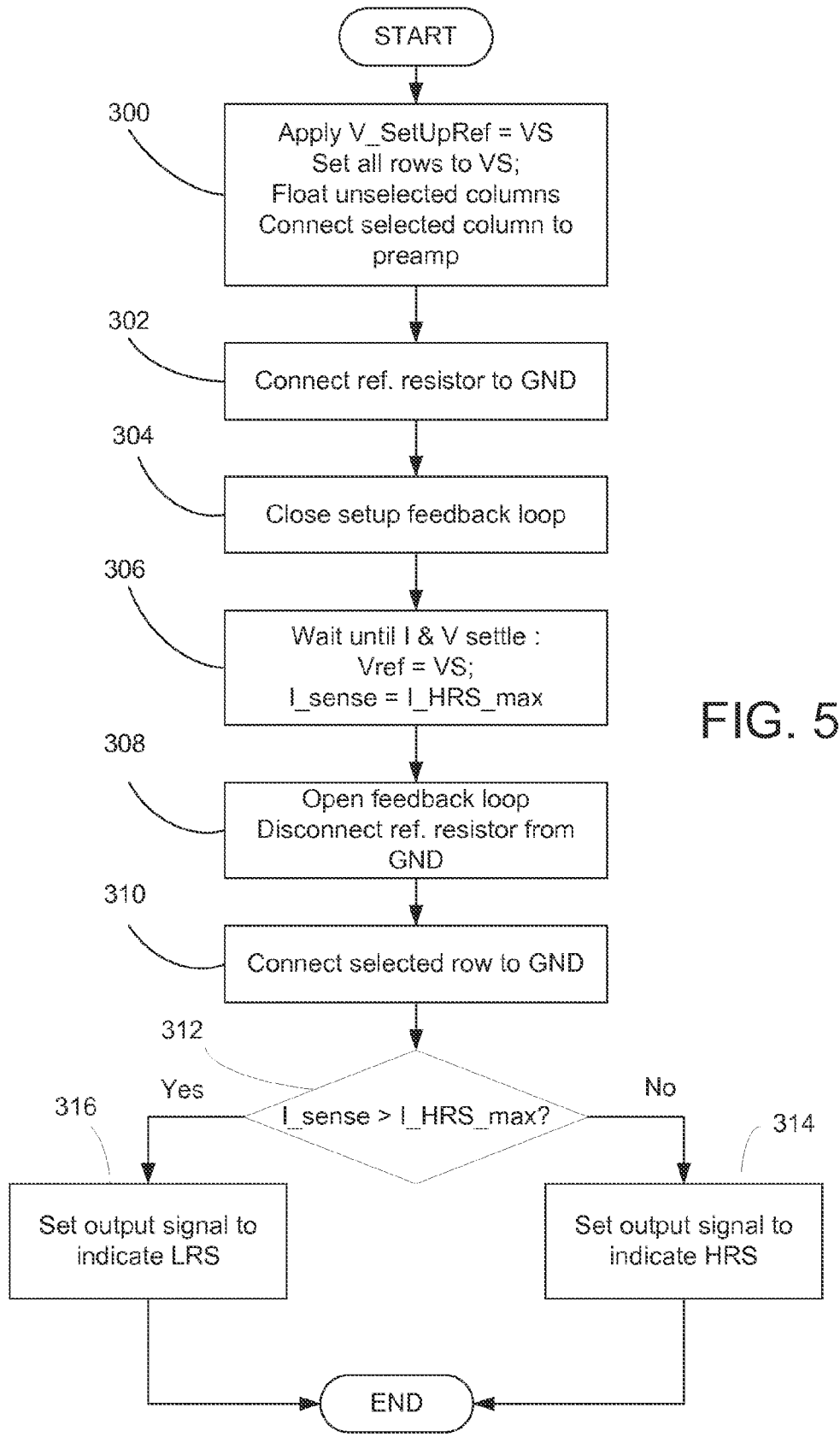
FIG. 5 is a flowchart showing a process of reading a selected resistive switching device in a crossbar using the circuit of FIG. 4.

The process of reading the target device 202 in the crossbar 210 using the read circuit 250 is now described with reference to the flowchart in FIG. 5. First, the circuit 250 is initialized for setting up the circuit for the read operation (step 300). To that end, the row lines (SR and UR) of the array are all connected to the read voltage V_S, which may be provided by an external voltage source. The unselected column lines UC are left floating. A setup reference voltage V_SetUpRef is applied to the positive input of the voltage comparator 280. In this embodiment, the value of the setup reference voltage is set to be the same as the read voltage V_S. The selected column line SC of the target device 202 to be read is connected to the negative input 266 of the operational amplifier 262.

Thereafter, a setup pulse pSetUp is applied to the transistor 278, thereby connecting the reference resistor 276 to ground (step 302). The feedback switch 272 is closed to close the feedback loop (step 304). As a result, the output of the voltage comparator 280 is applied to positive input 264 of the operational amplifier 262 via the feedback switch 272. Due to the application of the voltage, a current I_Sense flows through the feedback resistor 268 from the output 270 to the negative input 266 of the operational amplifier. The output voltage of the operational amplifier 262 is fed to the voltage comparator 280 as an input. The voltage comparator 280 compares the output voltage of the operational amplifier 262 with the setup voltage V_SetUpRef, and changes its output voltage accordingly. The changed output of the voltage comparator then goes through the feedback path to the positive input of the operational amplifier 262. This feedback process is left on for a sufficient time until the voltages and current transients settle (step 306). At the end of this feedback-controlled process, the equipotential preamplifier reference voltage V_Ref on the positive input of the operational amplifier 264 is close to the sense voltage V_S applied to the row lines, but with a slight difference such that the preamplifier 260 is in its linear operating range and is passing a pre-selected amount of current. Specifically, the current I_Sense flowing through the feedback resistor 268 is the current output of the preamplifier 260. It includes two components: a current flowing through the reference resistor 276, and a leakage current component flowing to the crossbar 200 via the selected column SC. The magnitude of the current flowing through the reference resistor 276 is designated I_HRS_max, and is close to V_S divided by R_HRS_min. By means of the selection of R_HRS_min, this amount of current is set to be higher than the current that would go through an HRS (high resistance state) device under V_S, but lower than the current through an LRS (low resistance state) device under V_S.

After the reference voltage V_Ref is set, the feedback loop is opened by opening the switch 272 (step 308). The reference voltage V_Ref is held by the sample-and-hold capacitor 274 and applied to the positive input of the operational amplifier 262. The setup pulse pSetUp is de-asserted to turn the transistor 278 off, thereby isolating the reference resistor 276 from the ground. This stops the current flowing through the reference resistor 276. As a result, the current I_Sense flowing through the feedback resistor 268 now is smaller than I_HRS_max. This causes the output V_Sense of the voltage comparator 280 to swing up to the supply voltage Vdd. This comparator output voltage is converted by the sense latch 288 to provide a digital signal Vout indicating a Logic 1. Now the circuit 250 has been set up and is ready for the read operation.

To initiate the read operation, the selected row SR of the target device 202 is connected to ground (step 310). Due to the equipotential approach, the current I_Sense generated by the preamplifier 260 and flowing to the crossbar is mainly the read current I_R_Device flowing through the target device 202, plus a small leakage component. The magnitude of I_Sense determines the voltage output V_Pre of the operational amplifier 262. The voltage comparator 280 takes V_Pre as an input and compares it to V_SetUpRef (step 312). If I_Sense is less than I_HRS_max, the output of the voltage comparator 280, V_Sense, goes toward Vdd. On the other hand, if I_Sense is greater than I_HRS_max, V_Sense goes toward ground. In this regard, a condition of I_Sense<I_HRS max indicates that the target device is in a high-resistance or OFF state, while a condition of I_Sense>I_HRS_max indicates that the target device is in a low-resistance or ON state. The output of the voltage comparator 280 is buffered by the sense latch 288 and converted into a digital output signal. If V_Sense goes up, the sense latch produces an output of Logic 1 (step 314). If V_Sense goes down, the sense latch produces an output of Logic 0 (step 316).

Figure 6:
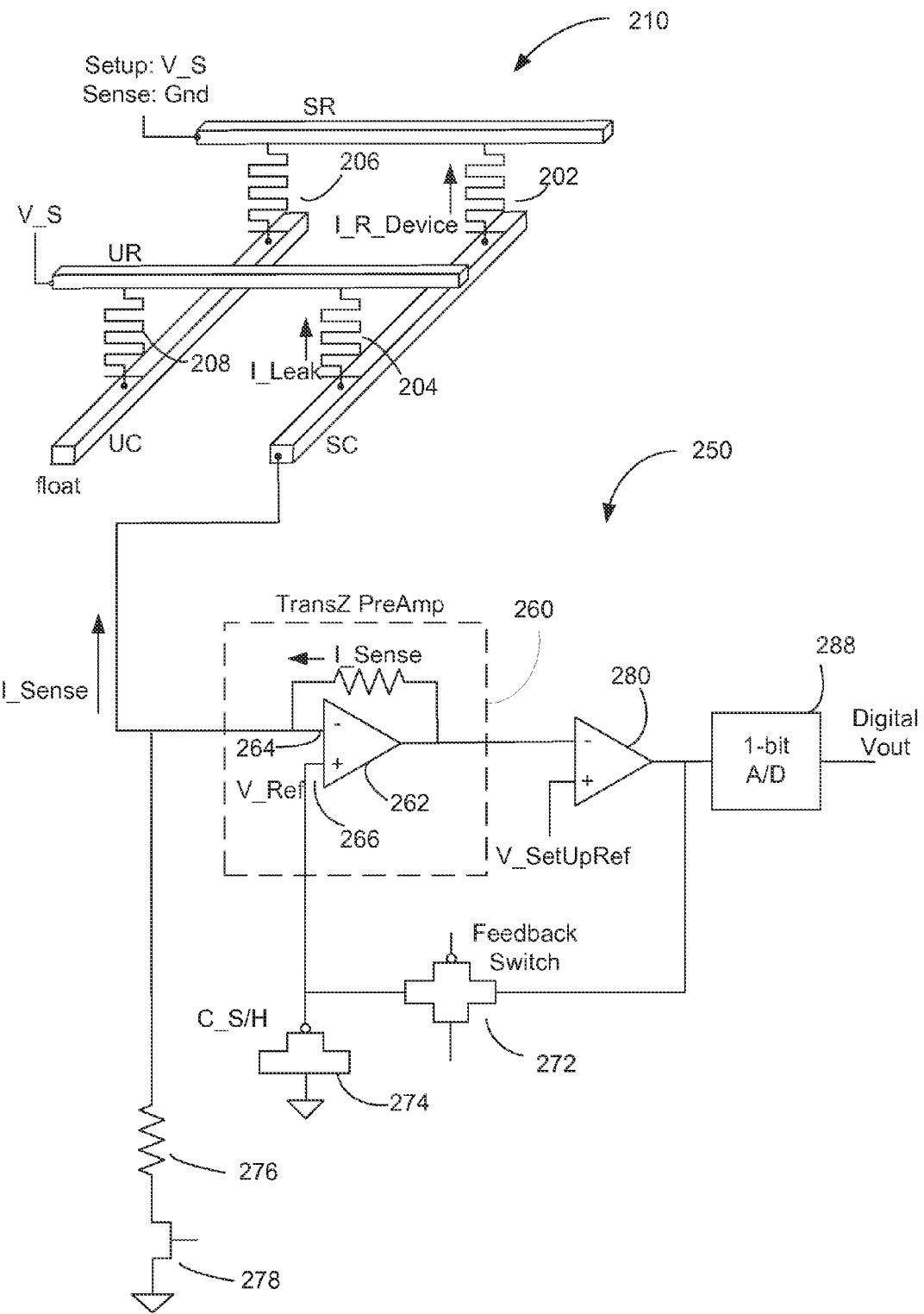
FIG. 6 is a schematic diagram of an implementation of the electronic circuit of FIG. 4 for reading a selected resistive switching device in a crossbar.

FIG. 6 shows implementation features of some components in the embodiment of the read circuit shown in FIG. 4. These implementation features facilitate the fabrication of the read circuit 250 using semiconductor fabrication techniques. Specifically, the sample-and-hold capacitor 274 may be implemented as a PMOS transistor. The drain and source of the transistor are connected together, and the gate is connected to the positive input of the operational amplifier 262. Thus, the capacitance utilized for the sample-and-hold function is the gate capacitance of the transistor. The feedback switch 272 is implemented as a PMOS transistor and an NMOS transistor tied together to form a transmission gate switch. Also shown in FIG. 6, the sense latch 288 may be implemented as a 1-bit A/D converter that outputs either a Logic 1 or a Logic 0 state.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A read circuit for sensing a resistance state of a resistive switching device in a crosspoint array, comprising:
    a transimpedance equipotential preamplifier for connecting to a selected column line of the resistive switching device in the array to deliver a sense current while maintaining the selected column line at a reference voltage near a biasing voltage applied to unselected row lines of the array;
    a reference resistor selectively connected to the equipotential preamplifier for setting a reference current, wherein the equipotential preamplifier is set to produce a preamplifier output voltage having a magnitude depending on whether the sense current is smaller or greater than the reference current; and
    a voltage comparator connected to the equipotential preamplifier to compare the preamplifier output voltage with a setup reference voltage and generate a comparator output voltage indicative of the resistance state of the resistive switching device.

2. A read circuit as in claim 1, further including an output buffer for converting the comparator output voltage into a digital output signal.

3. A read circuit as in claim 2, wherein the output buffer is a 1-bit A/D converter.

4. A read circuit as in claim 1, further including setup components for setting the reference voltage of the equipotential preamplifier based on the reference current set by the reference resistor.

5. A read circuit as in claim 4, wherein the setup components for setting the reference voltage include a feedback switch for selectively connecting an input of the equipotential preamplifier to an output of the voltage comparator during a setup stage, and wherein the reference resistor is connected to the equipotential preamplifier to draw the reference current from the equipotential preamplifier in the setup stage.

6. A read circuit as in claim 5, wherein the reference resistor is connected by a current setup switch to ground, the current setup switch being closed during the setup stage and being open while reading the resistance state of the resistive switching device.

7. A read circuit as in claim 4, wherein the setup components for setting the reference voltage further include a sample-and-hold capacitor connected to the input of the equipotential preamplifier for maintaining the reference voltage.

8. A read circuit as in claim 7, wherein the sample-and-hold capacitor is a gate capacitance of a transistor.

9. A read circuit as in claim 1, wherein the reference resistor has a resistance selected to be greater than an ON state resistance of the resistive switching device and smaller than an OFF state resistance of the resistive switching device.

10. A method of reading a resistance state of a resistive switching device in a crosspoint array, comprising:
    connecting a transimpedance equipotential preamplifier to a selected column line of the resistive switching device in the array;
    setting a reference voltage to operate the equipotential preamplifier, the reference voltage being set while drawing a reference current from the equipotential preamplifier;
    generating, by the equipotential preamplifier, a sense current flowing to the selected column line while biasing the selected column line to the reference voltage;
    comparing a preamplifier output voltage with a setup reference voltage; and
    generating a comparison output voltage based on the comparison, wherein the comparison output voltage depends on whether the sense current is greater or smaller than the reference current, which is indicative of the resistance state of the resistive switching device.

11. A method as in claim 10, further including the step of converting the comparison output voltage into a digital output signal.

12. A method as in claim 10, wherein the step of setting the reference voltage includes:
    connecting a reference resistor to a current output of the equipotential preamplifier to draw current from the equipotential preamplifier;
    comparing an output voltage of the equipotential preamplifier with a setup reference voltage to generate a comparison output voltage,
    feeding the comparison output voltage back to an input of the equipotential preamplifier until a voltage at the input of the equipotential preamplifier settles to form the reference voltage, wherein the reference resistor passes the reference current under the reference voltage.

13. A method as in claim 12, further including the step of sampling and holding the reference voltage using a capacitor connected to the input of the equipotential preamplifier.

14. A method as in claim 12, wherein the reference resistor has a resistance selected to be greater than an ON-state resistance of the resistive switching device and smaller than an OFF-state resistance of the resistive switching device.

15. A method as in claim 12, further including the step of electrically disconnecting the comparison output voltage from the input of the equipotential preamplifier after setting the reference voltage.

* * * * *